331-98

TX-1144
X-1365
X-250/40

Feb. 19, 1957 J. E. STANKEY 2,782,265

RADIO FREQUENCY OSCILLATOR-AMPLIFIER TUNING UNIT

Filed July 24, 1952 3 Sheets-Sheet 1

INVENTOR.
JOHN E. STANKEY
BY Wade Koontz and Orlando T. McCoy
ATTORNEYS

Feb. 19, 1957 J. E. STANKEY 2,782,265

RADIO FREQUENCY OSCILLATOR-AMPLIFIER TUNING UNIT

Filed July 24, 1952 3 Sheets-Sheet 2

INVENTOR.
JOHN E. STANKEY
BY Wade Koontz
and
Orlando T. McCoy
ATTORNEYS

INVENTOR.
JOHN E. STANKEY
BY Wade Koontz and Orlando Z. McCoy
ATTORNEYS 2,782,265

RADIO FREQUENCY OSCILLATOR-AMPLIFIER TUNING UNIT

John Edward Stankey, Altadena, Calif., assignor to the United States of America as represented by the Secretary of the Air Force Application July 24, 1952, Serial No. 300,671

4 Claims. (Cl. 179—171)

This invention relates to an oscillator of the tuned plate, tuned cathode type and a similarly constructed amplifier in a radio frequency tuning unit.

Oscillators of the tuned plate, tuned cathode type have been known heretofore over which the present device is an improvement in that resonant lines are provided with shorting bars and capacitors that are tuned simultaneously for adjusting the tank circuit by a single operation in bringing the oscillator to resonance.

The radio frequency tuning unit contemplated hereby comprises a plurality of tunable resonant lines from which frequencies are derived from loops positioned in the lines. The device is adapted for use in an illustrative frequency band of from 40 to 400 megacycles per second.

An illustrative embodiment of the present invention is shown in the accompanying drawings wherein.

Figure 6:
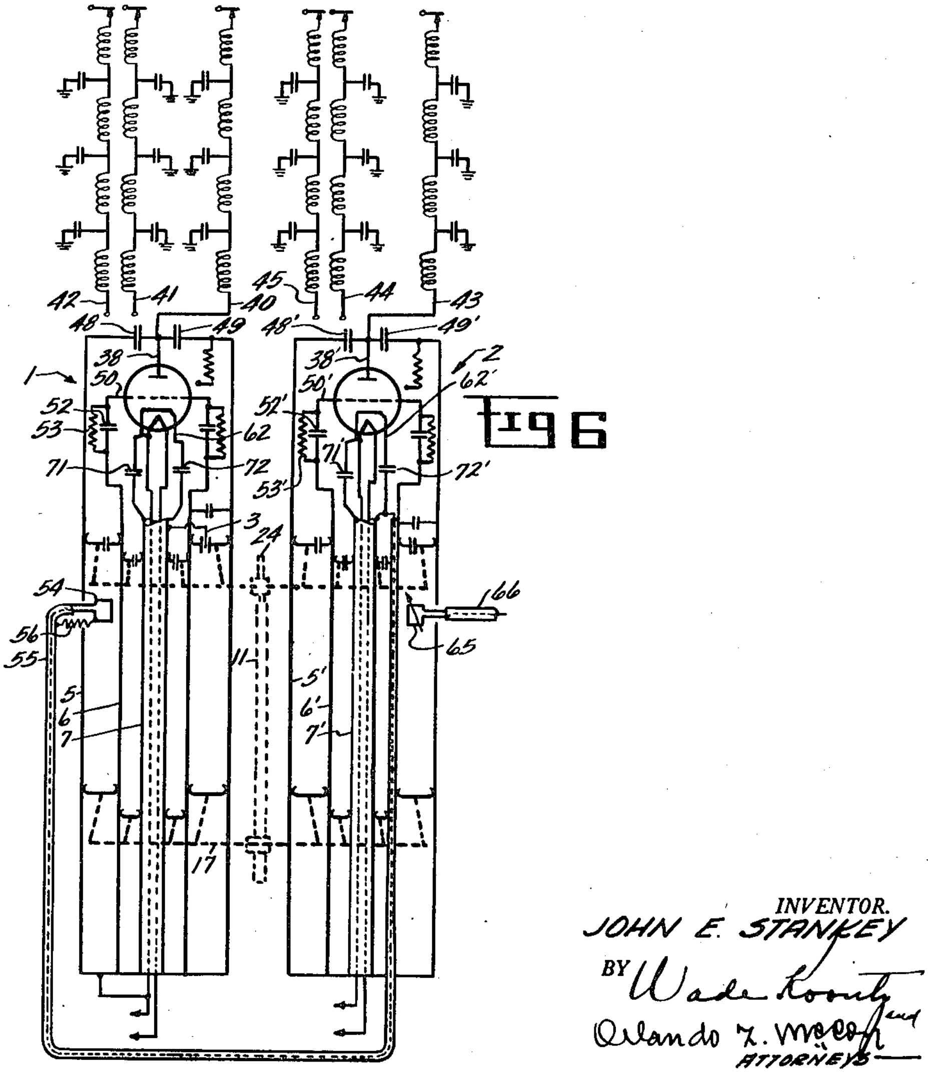
Figure 6 is a schematic circuit of the device shown in Figure 1.

The radio frequency tuning unit shown in the accompanying drawings comprises an oscillator section 1 feeding its output to and positioned above an amplifier section 2 and preferably inclusive of a leakage minimizing filter circuit shown above the oscillator and amplifier sections in Figure 6 of the accompanying drawings.

The oscillator section 1 and the amplifier section 2 are substantially duplicates of each other with the exception of a feedback trimmer condenser 3 in the oscillator section 1 and not in the amplifier section 2. Because of the similarity of the construction of the oscillator and the amplifier sections, corresponding numerals are used in both but are primed in the amplifier section.

Each of the sections 1 and 2 comprises three electrical conductors, illustratively shaped as hollow tubes or concentric cylinders: an outer cylinder 5, an inner cylinder 6 and an innermost cylinder 7. The hollow tubes or cylinders may be referred to also as the outer conductor 5, the inner conductor 7 and the intermediate conductor 6. The outer cylinders 5 and 5' are supported and are spaced from each other by supporting spacers 8 and 9 positioned between and adjacent opposite ends of the two cylinders 5 and 5'. In each section the inner cylinder 6 and the innermost cylinder 7 are maintained in relative position within the outer cylinder 5 in the front end of the device shown to the left in Figure 1 by polystyrene spacers 46' and 47' and at their opposite ends by insulating supports and associated equipment to be described below. In the front end of the device the cylinders 5 and 5' are closed by caps 75 and 75' respectively. In the rear of the device the cylinders 5 and 5' are closed with caps 76 and 76' respectively.

The lines between the plurality of concentric electrically conductive tubular conductors represented by the cylinders 5, 6 and 7 are tuned in a desired manner and preferably by a shorting bar assembly 10 threaded on a lead screw 11 turned by operation of a crank 4 accessible at the front of the device. The lead screw 11 is journalled in bearings mounted in the front spacer 8 and in a rear transverse support 18. The lead screw 11 extends axially of the device between and parallel to a pair of slide rods 28 and 29.

The moving shorting bar assembly 10, through webs 17 and 17', carries in both of the sections 1 and 2 a desired plurality of contact fingers 12, 13, 14, 15, 16 etc. that short circuit where contacted the cylinders 5, 6 and 7 in the oscillator section 1 and the cylinders 5', 6' and 7' in the amplifier section 2.

The rotation of the lead screw 11 turns speed reduction gears in a gear train 27. The gear train 27 provides a desired reduction ratio for turning a finely threaded sub-shaft 24 extending axially of the device between and having its end journalled in the transverse support 18 and the rear cylinder spacer 9.

Figure 1:
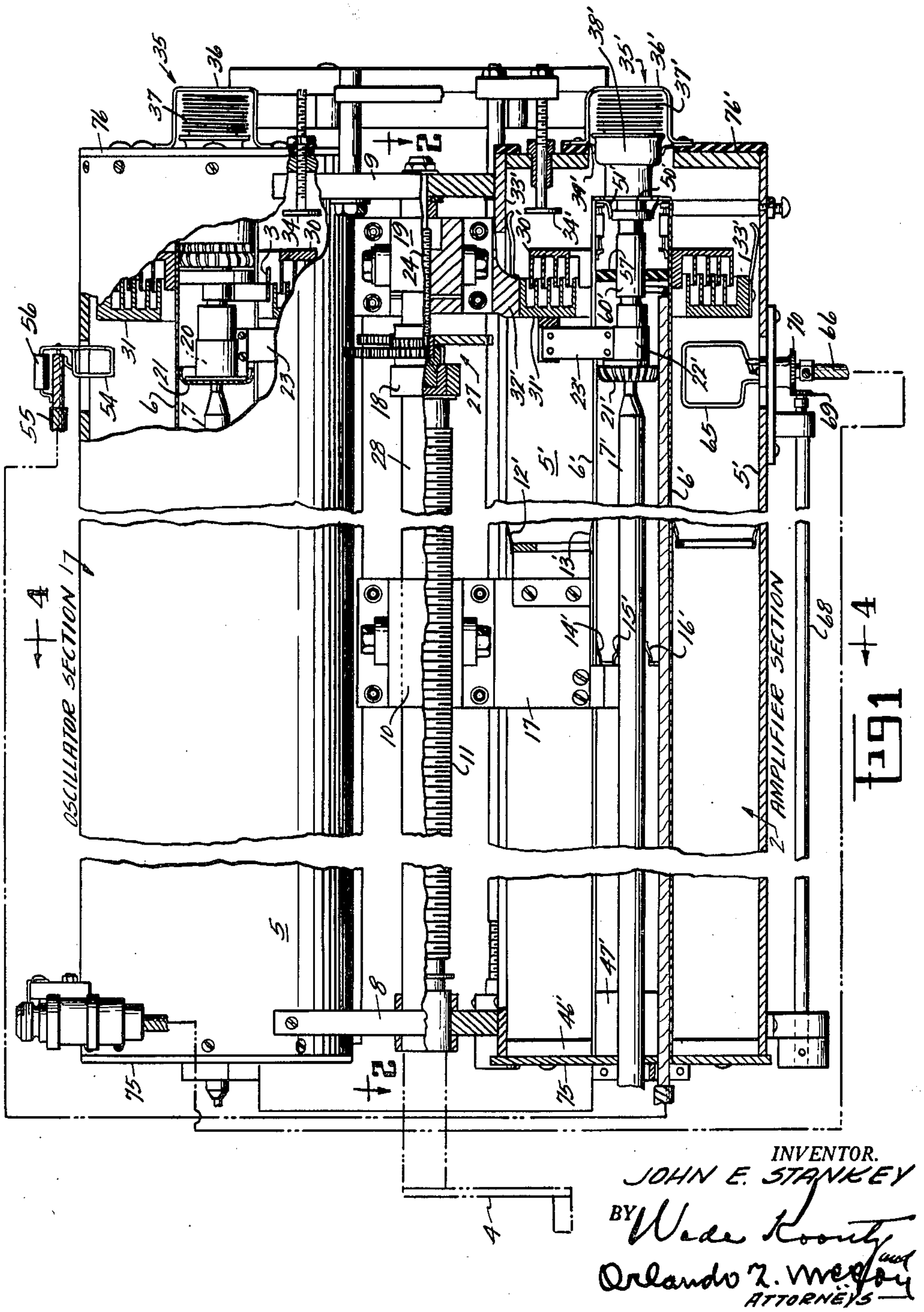
Figure 1 is a side elevation partly broken away and in section of a tuning unit that embodies the present invention.
Figure 2:
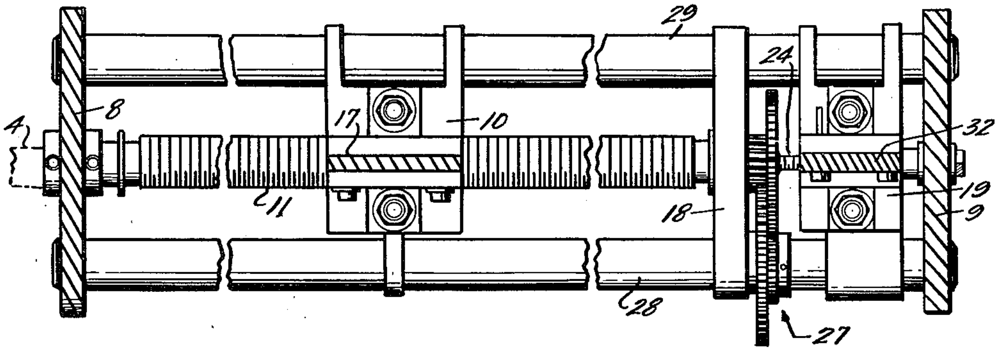
Figure 2 is a horizontal sectional view taken along the line 2—2 of Figure 1.
Figure 3:
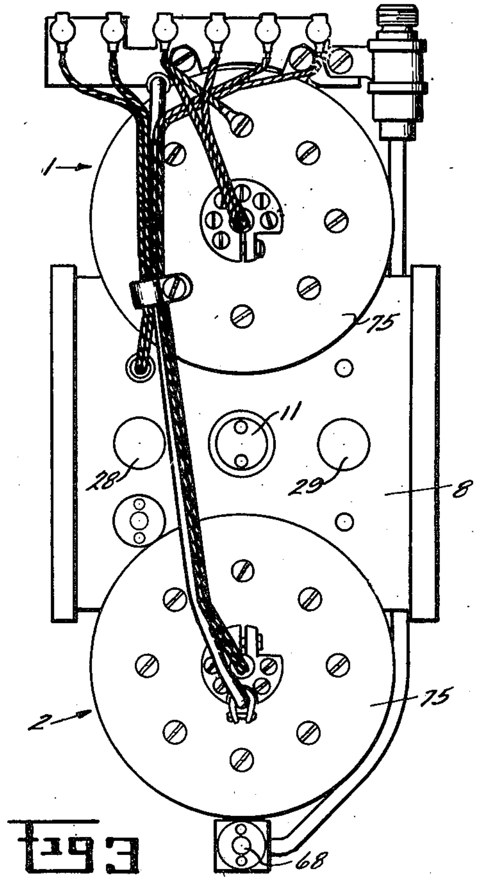
Figure 3 is an end elevation of the front end of the device shown in Figure 1.
Figure 4:
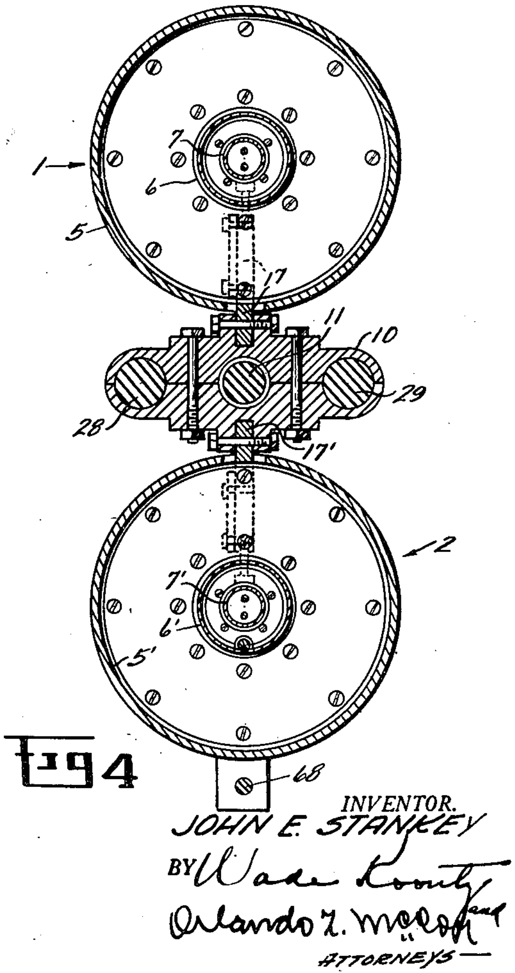
Figure 4 is a vertical transverse sectional view taken along the line 4—4 of Figure 1.

An axially movable capacitor plate support 19 rides on the pair of rods 28 and 29 and threads on the sub-shaft 24 for movement axially of the device. The capacitor plate support 19 has attached thereto an upwardly projecting arm 32 carrying movable outer cylinder capacitor plates 31 in the oscillator section 1 part of the device and a downwardly projecting arm 32' carrying movable outer cylinder capacitor plates 31' in the amplifier section 2 of the device. The movable outer cylinder condenser or capacitor plates 31' are connected through contact fingers 33' with the inner surface of the outer cylinder 5'. A trimmer condenser 34 is in a capacitive relation with the fixed condenser plates 30 and is maintained on a screw threaded shaft as shown for adjustment with a screw driver from outside the device for compensating variations in minimum capacity. The oscillator feedback trimmer condenser 3, as shown in Figs. 1 and 6 of the drawings, is a capacitor plate spaced in capacitive relation with both the capacitor plates 30 and the capacitor plates 31. The oscillator feedback trimmer condenser 3 is connected directly to the innermost cylinder 7.

The movable outer cylinder capacitor plates 31' carry an arm 23' that supports another set of movable inner cylinder capacitor plates 20 that carry contact fingers 21' slidably engaging the inner surface of the inner cylinder 6'. The movable inner cylinder capacitor plates 20 are maintained to be advanced and retracted axially of the cylinder 6' toward and away from a set of fixed inner cylinder capacitor plates 22.

The oscillator section 1 and the amplifier section 2 each has a magnetron or light house tube 35 at its rear end secured in place by a clamp 36 engaging the tube radiator 37. The light house tube anode 38 is engaged by finger contacts 39 through which the tube plate 38 is connected through capacitors 48 and 49 with the outer cylinder 5, as indicated in Figure 6 of the drawings. The tube grid 50 is engaged by finger contacts 51 to which connection is made through a capacitor 52 shunted by a resistor 53 to the inner cylinder 6. The amplifier tube grid 50' is connected with the amplifier inner cylinder 6' and with the outer conductor of the coaxial cable 55 conducting energy from the oscillator output loop 54.

The oscillator output loop 54 is fixed in position within the resonant line of the oscillator section 1.

Figure 5:
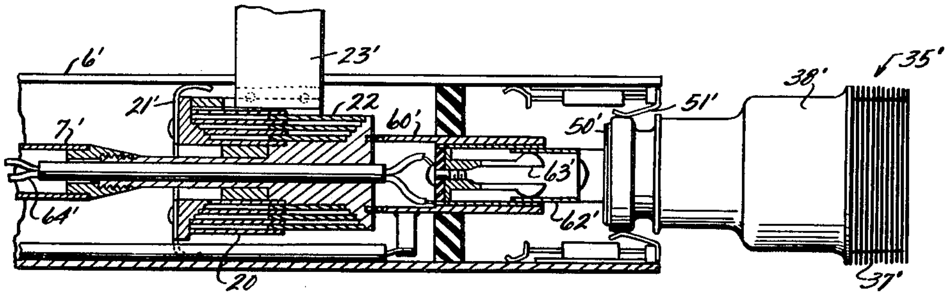
Figure 5 is a vertical longitudinal section of a variable capacitor between the innermost cylinder and the cathode of a light house vacuum tube in the amplifier section of Figure 1.

The coaxial cable 55 has its outer conductor connected to the loop 54 through a resistor 56, as shown, and its inner conductor is connected to the amplifier section innermost cylinder 7'. The amplifier section innermost cylinder 7' is capacitively coupled with the light house tube cathode 62'. In Figure 5 the fixed inner cylinder capacitor plates 22 are shown connected to a cylindrical contact 60' engaging the cathode 62' of the light house tube 35'. The tube element 63' derives electrical energy from a lead 64' brought into the device through the innermost cylinder 7'.

The cable 55 conducts output from the oscillator section 1 to the amplifier section 2. The tube cathode 62 is connected through capacitors 71 and 72 with the innermost cylinder 7, to which the oscillator feedback condenser 3 also is connected in the oscillator section 1.

The oscillator anode 38 is maintained at a predetermined potential through a leakage minimizing LC filter circuit 40, for which alternate filter circuits 41 or 42 may be substituted where desired. The amplifier section tube anode 38' is maintained at a desired plate potential through a leakage minimizing LC filter circuit 43 for which other filter circuits of different values may be substituted, such as the filter circuits 44 and 45 shown.

Amplified output from the radio frequency tuning unit is taken from a rotatable amplifier section loop 65 within the tuned amplifier line between the amplifier outer cylinder 5' and the amplifier inner cylinder 6' and is conducted to a desired destination by coaxial cable 66. The rotation of the amplifier section loop 65 is accomplished by operation, preferably from the front of the device, of a shaft 68 through a pair of level gears 69 and 70.

It is to be understood that modifications and substitutions in the equipment and circuit disclosed herein may be made without departing from the scope of the invention.

What I claim is:

1. In a radio frequency tuning unit consisting of an oscillator section and an amplifier section, a high frequency radio oscillator, of the tuned plate, tuned cathode type, a vacuum tube having as electrodes a grid, a plate and a cathode, a multiple concentric conductor pair of separate and distinct members which end at different points and each of which has inner, intermediate and outer concentric conductors extending coaxially with each other and at a common end connected respectively to the cathode, grid and plate electrodes of said vacuum tube, with the inner conductor capacitively coupled with the tube cathode electrode and with the intermediate conductor capacitively coupled with the tube grid electrode and with the outer conductor capacitively coupled with the tube plate electrode, axially movable shorting conductors terminating the outer end of each of said pair of members, variable capacitors terminating the inner end of each of said pair of members and connected across pairs of electrodes of said vacuum tube, a feedback circuit including a variable capacitor coupling the cathode and plate of said vacuum tube, and a single lead screw adjustable operating means simultaneously adjusting both sections of the tuning unit and mechanically connected to said shorting conductors and to said variable capacitors for simultaneously adjusting the same at different but coordinated rates to vary the frequency of the oscillator.

2. A radio frequency tuning unit, comprising an oscillator section, and an amplifier section with the oscillator section and the amplifier section providing two separate and distinct sections beginning and ending at different places and laterally juxtaposed and substantially parallel with each other, said oscillator section comprising an oscillator section resonant line, shorting means at a first end of said oscillator section resonant line for tuning to resonance said oscillator section resonant line, tunable capacitor means terminating a second opposite end of said oscillator section resonant line, an oscillator section feedback trimmer condenser at the tunable capacitor second end of said oscillator section resonant line and in capacitive relation with the oscillator section tunable capacitor means, oscillator section vacuum tube means at the tunable capacitor second end of said oscillator section resonant line and with its electrodes connected therewith and particularly an input electrode connected with a plate of said oscillator section feedback trimmer condenser capacitively coupled both with the first capacitor plate connected to the oscillator section tube anode electrode and with a second capacitor plate connected to the oscillator section tube grid electrode, an oscillator section output collecting loop in the oscillator section resonant line and supplying the oscillator frequency as amplifier section input, and said amplifier section comprising an amplifier section resonant line, a shorting means at a first end of said amplifier section resonant line for tuning to resonance said amplifier section resonant line, tunable capacitor means terminating a second end of said amplifier section resonant line remote from said shorting means, amplifier section vacuum tube means at the tunable capacitor second end of said amplifier section resonant line and with its vacuum tube electrodes connected with the tunable capacitors at the second end of the amplifier section resonant line, lead screw means operable from outside the sections for simultaneously tuning both the shorted ends and the capacitor means terminated ends of both the oscillator section resonant line and the amplifier section resonant line, amplifier input means connected to said oscillator output collecting loop, and an amplifier output collecting loop in said amplifier section resonant line and providing the output from said tuning unit.

3. A radio frequency tuning unit assembly, comprising an oscillator section and an amplifier section, the sections being substantially duplicates of each other except for a tunable feedback trimmer condenser in the oscillator section only and with each section comprising a plurality of concentric tubular electrical conductors beginning and ending at different places in operatively separate and distinct conductors, short circuiting bar means contacting for electrical conductance the plurality of tubular conductors in pairs and adjustable longitudinally thereof, a single adjustable lead screw means operable from outside the sections for altering by a single adjustment the position of the shorting bar means along the plurality of tubular conductors, a gear train operated variable capacitor means adjusted by the lead screw means between the pair of the tubular conductors remote from where the short circuiting bar means contacts the conductors, each section also comprising a vacuum tube with a plurality of electrodes capacitively connected with the tubular conductors remote from where the short circuiting bar means contacts the conductors such that an anode electrode of the tube is capacitively coupled with the outermost conductor, a grid electrode of the tube is capacitively coupled with an inner conductor and a cathode electrode of the tube is capacitively coupled with the innermost conductor, loop means deriving energy as output from the oscillator section, oscillator loop means output energy conducting means connecting the oscillator section output loop means across the grid-cathode circuit of the tube in the amplifier section, a tunable feedback trimmer condenser in the oscillator section of the assembly and in capacitive relation with both the conductors and with the vacuum tube electrodes, and amplifier section output rotatable loop means positioned within a cavity between the outer and the inner electrical conductors and providing output from the radio frequency tuning unit assembly.

4. A radio frequency tuning unit assembly, comprising an oscillator section and an amplifier section, the oscillator section embodying a plurality of concentric tubular electrical conductors, short circuiting bar means contacting in pairs a plurality of the conductors by being adjustably positioned longitudinally thereof, a vacuum tube with a plurality of electrodes capacitively coupled with the plurality of conductors inclusive of a tube plate electrode capacitively coupled with an outer conductor and a tube grid electrode capacitively coupled with an inner conductor and a tube cathode electrode capacitively coupled with an innermost conductor, and a tunable feedback trimmer condenser in the oscillator section of the assembly and capacitively coupling the vacuum tube cathode electrode with the vacuum tube grid electrode and capacitively coupling the vacuum tube cathode electrode with the vacuum tube plate electrode, the amplifier section embodying a plurality of concentric tubular electrical conductors, short circuiting bar means contacting in pairs a plurality of the conductors by being adjustably positioned longitudinally thereof, a vacuum tube with a plurality of electrodes capacitively coupled with the plurality of conductors inclusive of a tube plate electrode capacitively coupled with the outer conductor and a tube grid electrode capacitively coupled with an inner conductor and a tube cathode electrode capacitively coupled with the innermost conductor, an adjustable lead screw operable from outside the assembly and adjusting by a single operation the positions of the short circuiting bar means along the conductors, a gear train operated by the lead screw, each section also comprising variable space plate type of capacitor means consisting of one immovable capacitor terminal at an inner conductor and another movable capacitor terminal adjustably positioned by operation of the lead screw through the gear train with respect to the immovable capacitor terminal, an oscillator signal energy pickup loop positioned between the oscillator outer and inner conductors and positioned near the end of the oscillator section containing the variable capacitor means and the vacuum tube electrode couplings, a coaxial cable connector connecting the oscillator signal energy pickup loop with the amplifier section vacuum tube electrodes, with the coaxial cable outer conductor capacitively coupled with the amplifier section vacuum tube grid electrode and with the coaxial cable inner conductor capacitively coupled with the amplifier section vacuum tube cathode electrode, and an amplifier section signal energy pickup loop positioned between the amplifier outer and inner conductors and positioned near the end of the amplifier section containing the variable capacitor means and the vacuum tube electrode couplings and providing an amplified signal energy output for the radio frequency tuning unit assembly derived from the amplifier section thereof.

References Cited in the file of this patent

UNITED STATES PATENTS

| | | |
|---|---|---|
| 2,169,305 | Tunick | Aug. 15, 1939 |
| 2,427,558 | Jensen et al. | Sept. 16 1947 |
| 2,463,417 | Overacker | Mar. 1, 1949 |
| 2,477,232 | Branson | July 26, 1949 |
| 2,531,693 | Lansman | Nov. 28, 1950 |
| 2,589,246 | Grimm | Mar. 18 1952 |
| 2,626,356 | Gibson | Jan. 20, 1953 |

FOREIGN PATENTS

| | | |
|---|---|---|
| 594,622 | Great Britain | Nov. 14, 1947 |